(12) United States Patent
Liang et al.

(10) Patent No.: US 9,905,474 B2
(45) Date of Patent: Feb. 27, 2018

(54) CMOS DEVICE WITH RAISED SOURCE AND DRAIN REGIONS

(75) Inventors: Chun-Sheng Liang, Puyan Township (TW); Hung-Ming Chen, Hsin-Chu (TW); Chien-Chao Huang, Hsin-Chu (TW); Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/210,993

(22) Filed: Aug. 16, 2011

(65) Prior Publication Data

US 2011/0298049 A1 Dec. 8, 2011

Related U.S. Application Data

(63) Continuation of application No. 11/588,920, filed on Oct. 27, 2006, now Pat. No. 8,008,157.

(51) Int. Cl.
*H01L 27/092* (2006.01)
*H01L 21/8238* (2006.01)
(Continued)

(52) U.S. Cl.
CPC .... *H01L 21/823814* (2013.01); *H01L 27/092* (2013.01); *H01L 29/665* (2013.01);
(Continued)

(58) Field of Classification Search
USPC .... 438/300, 233, 509; 257/E21.43, E21.431, 257/E21.634, 371, 227, 374, 219
See application file for complete search history.

(56) References Cited

U.S. PATENT DOCUMENTS

| 4,998,150 A | * | 3/1991 | Rodder | H01L 29/0847 |
| | | | | 257/288 |
| 5,504,031 A | | 4/1996 | Hsu et al. | |
| | | | (Continued) | |

FOREIGN PATENT DOCUMENTS

TW 253716 B 4/2006

OTHER PUBLICATIONS

Hokazono, A., et al., "Source/Drain Engineering for Sub-100 nm CMOS Using Selective Epitaxial Growth Technique," IEEE 2000, IEDM 00-243, pp. 10.6.1-10.6.4.
(Continued)

*Primary Examiner* — Bradley K Smith
*Assistant Examiner* — David Goodwin
(74) *Attorney, Agent, or Firm* — Slater Matsil, LLP

(57) ABSTRACT

A semiconductor structure includes a semiconductor substrate comprising a PMOS region and an NMOS region; a PMOS device in the PMOS region; and an NMOS device in the NMOS region. The PMOS device includes a first gate stack on the semiconductor substrate; a first offset spacer on a sidewall of the first gate stack; a stressor in the semiconductor substrate and adjacent to the first offset spacer; and a first raised source/drain extension region on the stressor and adjoining the first offset spacer, wherein the first raised source/drain extension region has a higher p-type dopant concentration than the stressor. The NMOS device in the NMOS region includes a second gate stack on the semiconductor substrate; a second offset spacer on a sidewall of the second gate stack; a second raised source/drain extension region on the semiconductor substrate and adjoining the second offset spacer; and a deep source/drain region adjoining the second raised source/drain extension region, wherein the deep source/drain region is free from stressors formed in the semiconductor substrate.

20 Claims, 5 Drawing Sheets

(51) Int. Cl.
*H01L 29/66* (2006.01)
*H01L 29/78* (2006.01)
*H01L 29/165* (2006.01)

(52) U.S. Cl.
CPC .. *H01L 29/66628* (2013.01); *H01L 29/66636* (2013.01); *H01L 29/7834* (2013.01); *H01L 29/7848* (2013.01); *H01L 29/165* (2013.01)

(56) References Cited

U.S. PATENT DOCUMENTS

| | | | |
|---|---|---|---|
| 5,834,343 A | 11/1998 | Ogasawara et al. | |
| 6,235,568 B1 | 5/2001 | Murthy et al. | |
| 6,479,358 B1 | 11/2002 | Yu | |
| 6,525,378 B1* | 2/2003 | Riccobene | 257/347 |
| 6,562,686 B2 | 5/2003 | Lee | |
| 6,790,733 B1 | 9/2004 | Natzle et al. | |
| 7,037,818 B2 | 5/2006 | Dokumaci et al. | |
| 7,078,742 B2 | 7/2006 | Lin et al. | |
| 7,098,514 B2 | 8/2006 | Oh et al. | |
| 7,112,495 B2 | 9/2006 | Ko et al. | |
| 7,164,163 B2 | 1/2007 | Chen et al. | |
| 7,176,110 B2* | 2/2007 | van Bentum | H01L 21/823418 257/E21.43 |
| 7,226,820 B2* | 6/2007 | Zhang | H01L 29/66636 257/E21.43 |
| 7,348,248 B2* | 3/2008 | Cheng | 438/301 |
| 7,358,551 B2 | 4/2008 | Chidambarrao et al. | |
| 7,361,563 B2 | 4/2008 | Shin et al. | |
| 7,504,301 B2* | 3/2009 | Waite | H01L 21/823807 438/255 |
| 7,718,500 B2* | 5/2010 | Chong | H01L 21/823807 257/E21.43 |
| 2004/0262683 A1* | 12/2004 | Bohr et al. | 257/338 |
| 2005/0035407 A1* | 2/2005 | Koh | H01L 29/665 257/344 |
| 2005/0035409 A1* | 2/2005 | Ko | H01L 21/26506 257/350 |
| 2005/0112817 A1 | 5/2005 | Cheng et al. | |
| 2005/0170594 A1 | 8/2005 | Yeo et al. | |
| 2005/0184345 A1 | 8/2005 | Lin et al. | |
| 2006/0003533 A1 | 1/2006 | Kammler et al. | |
| 2006/0088968 A1 | 4/2006 | Shin et al. | |
| 2006/0131656 A1 | 6/2006 | Shin et al. | |
| 2007/0020864 A1 | 1/2007 | Chong et al. | |
| 2007/0138570 A1 | 6/2007 | Chong et al. | |
| 2007/0194387 A1 | 8/2007 | Dyer et al. | |
| 2008/0277735 A1 | 11/2008 | Ko et al. | |
| 2009/0068810 A1 | 3/2009 | Tsai et al. | |
| 2011/0127614 A1* | 6/2011 | Scheiper et al. | 257/369 |

OTHER PUBLICATIONS

Adey, J., et al., "Enhanced Dopant Solubility in Strained Silicon," Journal of Physics: Condensed Matter, vol. 16 (2004) pp. 9117-9126, IOP Publishing Ltd., UK.

Thompson, S.E., et al., "A 09-nm Logic Technology Featuring Strained-Silicon," IEEE Transactions on Electron Devices, vol. 51, No. 11, Nov. 2004, pp. 1790-1797.

Yasutake, N., et al., "A hp22 nm Node Low Operating Power (LOP) Technology with Sub-10 nm Gate Length Planar Bulk CMOS Devices," 2004 Symposium on VLSI Technology Digest of Technical Papers, IEEE, pp. 84-85.

Wakabayashi, H., et al., "Improved Sub-10-nm CMOS Devices with Elevated Source/Drain Extensions by Tunneling Si-Selective-Epitaxial-Growth," Electron Devices Meeting, 2005, IEDM Technical Digest, IEEE International, Dec. 2005, pp. 145-148.

* cited by examiner

CMOS DEVICE WITH RAISED SOURCE AND DRAIN REGIONS

This application is a continuation of U.S. patent application Ser. No. 11/588,920, filed on Oct. 27, 2006, entitled "CMOS Device with Raised Source and Drain Regions," which application is incorporated herein by reference in its entirety.

TECHNICAL FIELD

This invention relates generally to semiconductor devices, and more particularly to metal-oxide-semiconductor (MOS) devices with raised source and drain regions.

BACKGROUND

With the scaling of integrated circuits, metal-oxide-semiconductor (MOS) devices become increasingly smaller. The junction depths of the MOS devices are also reduced accordingly. This reduction causes technical difficulties during the formation processes. For example, small MOS devices demand higher dopant concentrations in source and drain regions in order to reduce resistivity in the source and drain regions. Controlling implantation depth for forming shallow junction in source and drain extension regions of small-scale devices is also difficult.

To solve the above-discussed problems, raised source and drain regions and/or raised lightly doped source and drain (LDD) regions have been formed. FIG. 1 illustrates a commonly formed MOS device having raised source/drain regions. In its formation, a gate stack including a gate dielectric 4 and a gate electrode 6 are formed on substrate 2. LDD regions 8 are then formed by implantation. Gate spacers 10 are then formed. An epitaxial growth is then performed to grow a crystalline silicon layer 12 on substrate 2. Source and drain regions 14 are then formed by an implantation.

FIG. 2 illustrates a MOS device with raised source and drain regions and raised LDD regions. A typical formation process includes forming offset spacers 16 on sidewalls of a gate stack including gate dielectric 4 and gate electrode 6, epitaxially growing a first silicon layer 18 on substrate 2, implanting impurities to form LDD regions 8, forming main spacers 10, epitaxially growing a second silicon layer 20 on first silicon layer 18, and implanting impurities to form source and drain regions 14.

In the conventional formation processes as shown in FIGS. 1 and 2, raised regions for PMOS and NMOS are typically formed simultaneously, and thus comprise the same materials. This process incurs several problems. First, since LDD regions are formed prior to the epitaxial growth, the epitaxial layers in PMOS and NMOS devices may have different thicknesses resulting from the different impurities in PMOS and NMOS devices. Second, epitaxial growth of silicon typically requires high temperatures, and thus excessive diffusion of dopant degrades short channel performance of the MOS devices. Further drawbacks include low activation rates and low solubilities (since impurities are implanted), and high silicide contact resistance, which results from the low activation rates and low solubilities of impurities.

What is needed in the art is a MOS device that may incorporate raised source and drain regions and/or LDD regions in order to take advantage of the benefits associated with improved MOS device performance while at the same time overcoming the deficiencies of the prior art.

SUMMARY OF THE INVENTION

In accordance with one aspect of the present invention, a method of forming a semiconductor structure includes forming a PMOS device in a PMOS region and forming an NMOS device in an NMOS region. The steps for forming the PMOS device include forming a first gate stack on a semiconductor substrate; forming a first offset spacer on a sidewall of the first gate stack; forming a stressor in the semiconductor substrate using the first offset spacer as a mask; and epitaxially growing a first raised source/drain extension region on the stressor, wherein the first raised source/drain extension region is in-situ doped with a first p-type dopant. The steps for forming the NMOS device include forming a second gate stack on the semiconductor substrate; forming a second offset spacer on a sidewall of the second gate stack; epitaxially growing a second raised source/drain extension region on the semiconductor substrate using the second offset spacer as a mask, wherein the second raised source/drain extension region is in-situ doped with a first n-type dopant; and forming a deep source/drain region adjoining the second raised source/drain extension region In accordance with another aspect of the present invention, a method of forming a semiconductor structure includes providing a semiconductor substrate comprising a PMOS region and an NMOS region; forming a first gate stack in the PMOS region and a second gate stack in the NMOS region; forming a first offset spacer on a sidewall of the first gate stack; forming a second offset spacer on a sidewall of the second gate stack; epitaxially growing a first epitaxy region comprising silicon and substantially free from germanium on the semiconductor substrate, wherein the first epitaxy region comprises a first portion adjoining the first offset spacer; and a second portion adjoining the second offset spacer, and wherein the first epitaxy region is in-situ doped with a first n-type dopant; forming a recess adjacent the first offset spacer by removing the first epitaxy region in the PMOS region and etching into the semiconductor substrate; epitaxially growing a silicon germanium stressor in the recess; and epitaxially growing a second epitaxy region on the silicon germanium stressor, wherein the second epitaxy region has at least a portion higher than a top surface of the semiconductor substrate, and wherein the second epitaxy region is in-situ doped with a first p-type dopant.

In accordance with yet another aspect of the present invention, a semiconductor structure includes a semiconductor substrate comprising a PMOS region and an NMOS region; a PMOS device in the PMOS region; and an NMOS device in the NMOS region. The PMOS device includes a first gate stack on the semiconductor substrate; a first offset spacer on a sidewall of the first gate stack; a stressor in the semiconductor substrate and adjacent to the first offset spacer; and a first raised source/drain extension region on the stressor and adjoining the first offset spacer, wherein the first raised source/drain extension region has a higher p-type dopant concentration than the stressor. The NMOS device in the NMOS region includes a second gate stack on the semiconductor substrate; a second offset spacer on a sidewall of the second gate stack; a second raised source/drain extension region on the semiconductor substrate and adjoining the second offset spacer; and a deep source/drain region adjoining the second raised source/drain extension region, wherein the deep source/drain region is free from stressors formed in the semiconductor substrate.

In accordance with yet another aspect of the present invention, a semiconductor structure includes a semiconductor substrate comprising a PMOS device in a PMOS region and an NMOS device in an NMOS region. The PMOS device includes a first gate stack on the semiconductor substrate; a first offset spacer on a sidewall of the first gate stack; a stressor in the semiconductor substrate and having a portion under the first offset spacer; a first raised source/drain extension region on the stressor and adjoining the first offset spacer, wherein the first raised source/drain extension region has at least a portion higher than a top surface of the semiconductor substrate; and a first main spacer on a sidewall of the first offset spacer, wherein the first main spacer has at least a portion on a top surface of the first raised source/drain extension region. The NMOS device includes a second gate stack on the semiconductor substrate; a second offset spacer on a sidewall of the second gate stack; a second raised source/drain extension region on the semiconductor substrate and adjoining the second offset spacer; a second main spacer on a sidewall of the second offset spacer, wherein the second main spacer has at least a portion on a top surface of the second raised source/drain extension region; and a deep source/drain region adjoining the second raised source/drain extension region, wherein a portion of the deep source/drain region, that is lower than a top surface of the semiconductor substrate, is free from stressors.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Research results have revealed that solubilities of impurities in source and drain regions of metal-oxide-semiconductor (MOS) devices are related to the strain in the source and drain regions. Typically, p-type impurities, such as boron, have improved solubility under compressive strains. N-type impurities, such as arsenic, have improved solubility under tensile strains. However, further research results have revealed that the improvement in solubility of arsenic under tensile strain is significantly less than the improvement in solubility of boron under compressive strain.

Based on this finding, a method for forming MOS devices is provided. The intermediate stages of manufacturing an embodiment of the present invention, which combines the formation of a PMOS device and an NMOS device, are illustrated. Throughout the various views and illustrative embodiments of the present invention, like reference numbers are used to designate like elements.

Figure 1:
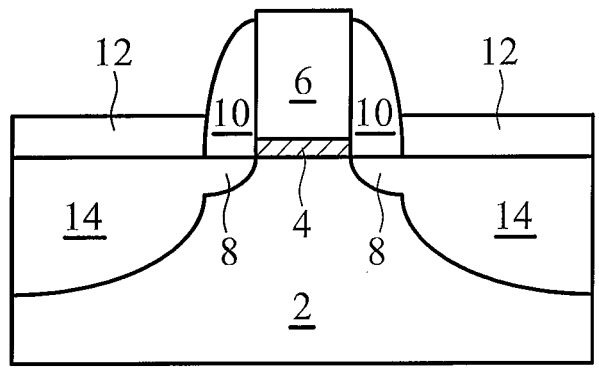
FIG. 1 illustrates a conventional MOS device having raised source and drain regions.
Figure 2:
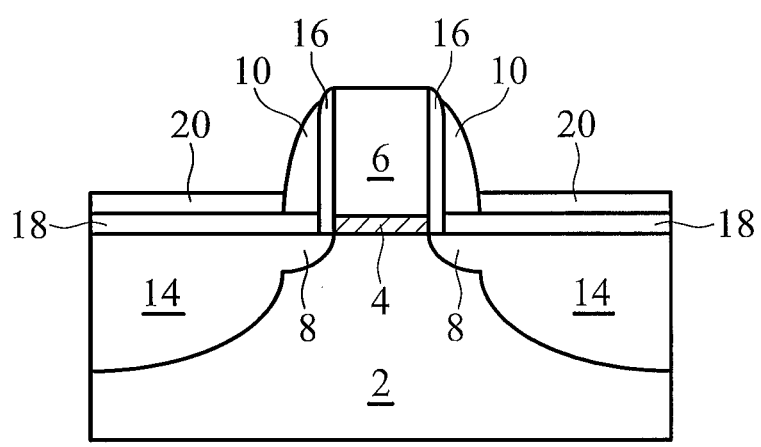
FIG. 2 illustrates a conventional MOS device having raised source and drain regions and raised source/drain extension regions.
Figure 3:
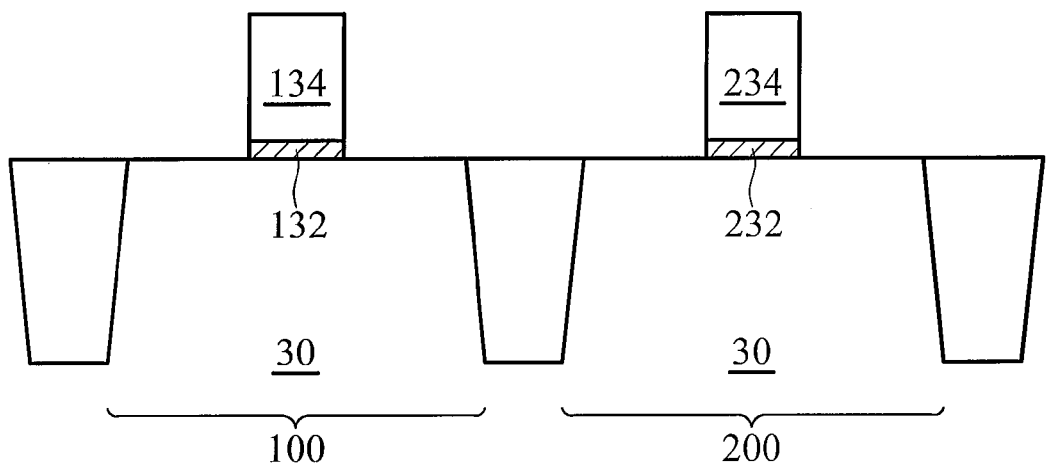
FIGS. 3 through 9 are cross-sectional views of intermediate stages in the manufacture of embodiments of the present invention.

Referring to FIG. 3, a substrate 30, which includes an NMOS region 100 and a PMOS region 200, is provided. Substrate 30 may comprise bulk silicon, although other commonly used structures and materials, such as silicon-on-insulator (SOI) structure and silicon alloys, can be used. Substrate 30 is preferably lightly doped.

A gate stack, including gate dielectric 132 and gate electrode 134, is formed in NMOS region 100. Another gate stack, including gate dielectric 232 and gate electrode 234, is formed in PMOS region 200. Each of the gate stacks may further include a mask layer (not shown) on respective gate electrodes 134 and 234, wherein the mask layers may be formed of silicon nitride. Alternatively, gate electrodes 134 and 234 are formed of other commonly used conductive materials such as metals, metal silicides, metal nitrides, and combinations thereof. Gate dielectrics 132 and 232 preferably include commonly used dielectric materials such as oxides, nitrides, oxynitrides, carbides, and combinations thereof. Gate electrodes 134 and 234 may be formed of polysilicon. As is known in the art, gate dielectrics 132 and 232 and gate electrodes 134 and 234 may be formed by stacking a gate electrode layer on a gate dielectric layer, and then patterning the stacked layers.

Figure 4:
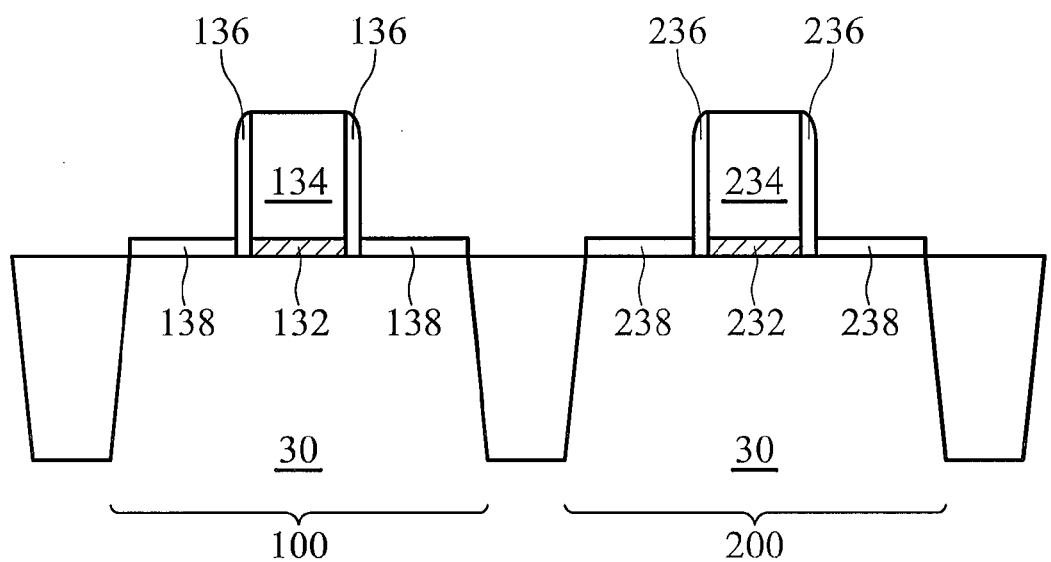

FIG. 4 illustrates the formation of offset spacers 136 and 236 and epitaxy regions 138 and 238. Preferably, offset spacers 136 and 236 are thin spacers, with preferred thicknesses less than about 100 Å. The preferred materials include commonly used spacer material such as oxides including silicon oxide, silicon nitride, and combinations thereof. As is known in the art, the formation of offset spacers 136 and 236 may include forming a spacer layer, and then patterning the spacer layer to remove its horizontal portions.

Epitaxy regions 138 and 238 are formed on exposed surfaces of substrate 30, preferably by selective epitaxial growth (SEG). Preferably, epitaxy regions 138 and 238 are formed of silicon. N-type impurities, such as arsenic and/or phosphorous, are preferably in-situ doped with the formation of epitaxy regions 138 and 238. In an exemplary embodiment, the thickness of epitaxy regions 138 and 238 is between about 50 Å and about 200 Å. N-type impurities are preferably doped to a concentration of between about $5*10^{19}/cm^3$ and about $10^{21}/cm^3$. Preferably, the temperature for the epitaxial growth is about 650° C. and about 850° C.

Figure 5:
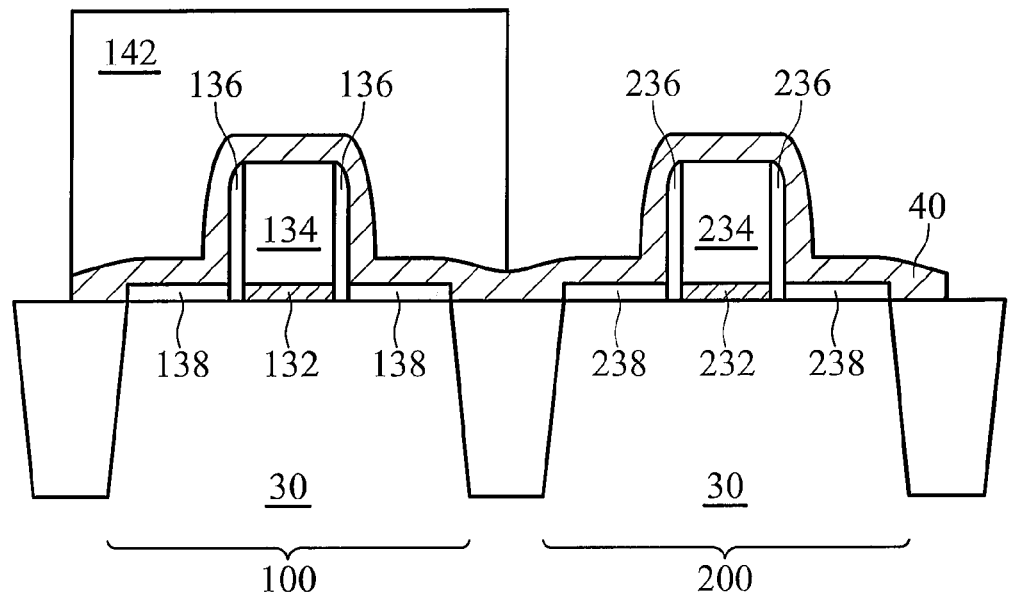

FIG. 5 illustrates the formation of hard mask layer 40, which includes a first portion in NMOS region 100 and a second portion in PMOS regions 200. Hard mask layer 40 is preferably blanket formed. A photoresist 142 is then applied and patterned to cover NMOS region 100. The second portion of hard mask 40 is then removed, followed by the removal of photoresist 142.

Figure 6:
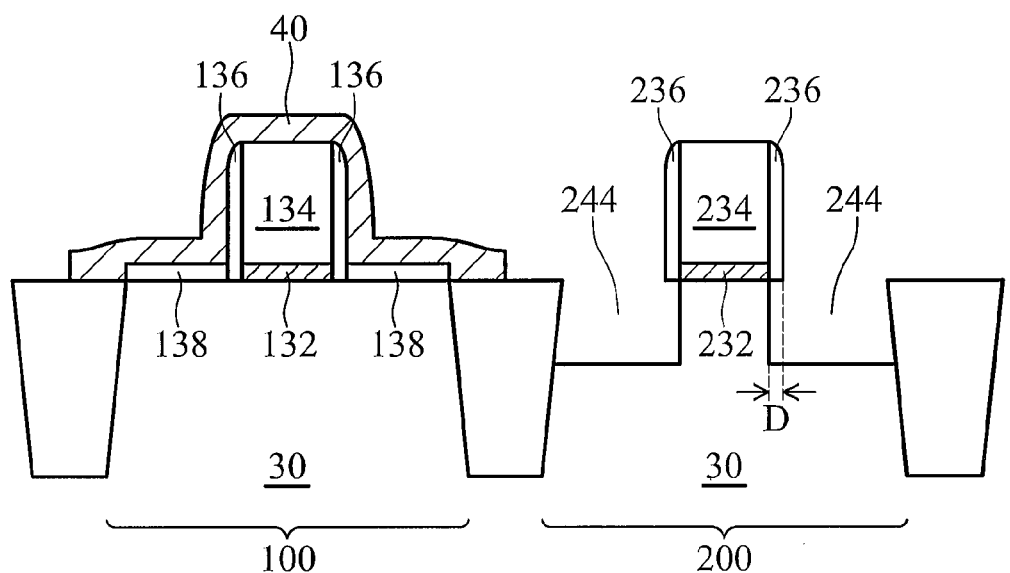

Referring to FIG. 6, recesses 244 are formed along the edges of offset spacers 236, preferably by etching anisotropically. In an exemplary embodiment formed using 90 nm technology, the preferred depth of recesses 244 is between about 500 Å and about 1000 Å, and more preferably between about 700 Å and 900 Å. It is appreciated, however, that the dimensions recited throughout the description are merely examples, and will scale accordingly with the scaling of the technology used in forming the integrated circuits.

After the formation of recesses 244, an isotropic etching may be performed to extend recesses 244 under offset spacers 236. In an embodiment, the isotropic etching uses HCl as a reaction gas, and is preferably performed at an elevated temperature, for example, higher than about 700° C. After the isotropic etching, recesses 244 preferably extend under offset spacers 236 for a distance D substantially equal to the thickness of offset spacers 236.

Figure 7:
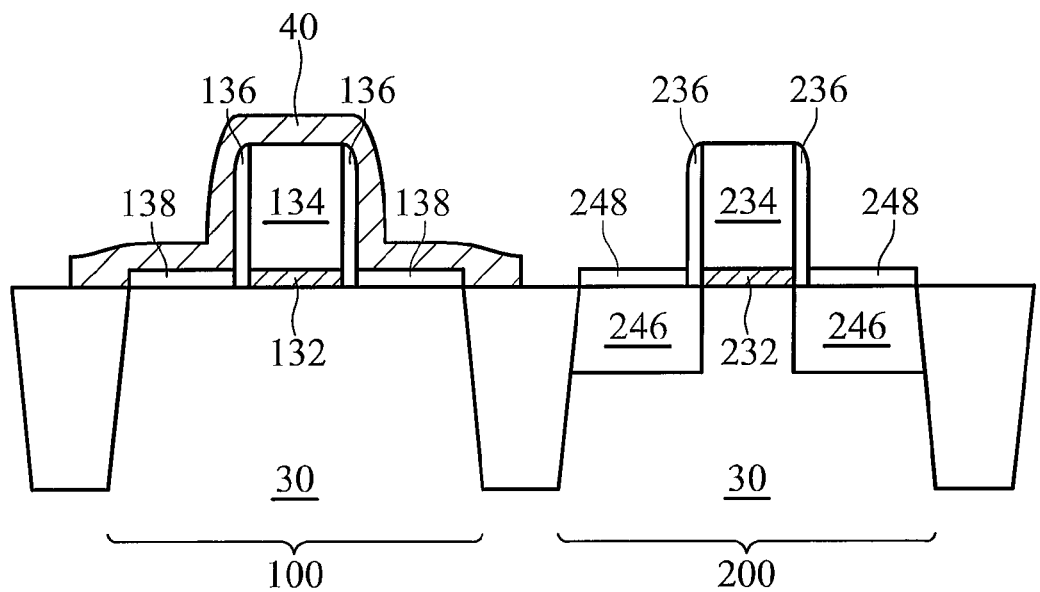

FIG. 7 illustrates the formation of epitaxy regions (often referred to as SiGe stressors), for example, by SEG. Preferably, SiGe stressors include SiGe regions 246 and overlying SiGe regions 248. In an exemplary embodiment, SiGe regions 246 and 248 are formed using plasma enhanced chemical vapor deposition (PECVD) in a chamber. The preferred temperature is between about 500° C. and about 700° C., which is lower than the temperature for forming epitaxial silicon regions 138 and 238. The precursors include Si-containing gases and Ge-containing gases, such as $SiH_4$ and $GeH_4$, respectively, and the partial pressures of the Si-containing gases and Ge-containing gases are adjusted to modify the atomic ratio of germanium to silicon. The resulting SiGe regions 246 have a germanium atomic percentage of between about 10 atomic percent and about 50 atomic percent. In one embodiment, no p-type dopant is doped during the epitaxial growth of SiGe regions 246. In alternative embodiments, p-type impurities, such as boron and/or indium, are in-situ doped to a low concentration, such as less than about $10^{18}/cm^3$. A top surface of SiGe regions 246 is preferably level with a top surface of substrate 30, and thus the subsequently formed SiGe regions 248 are raised regions. Alternatively, the top surfaces of SiGe regions 246 are higher than the top surface of substrate 30.

After the formation of SiGe regions 246, process conditions are changed to form SiGe regions 248. Preferably, SiGe regions 248 are in-situ doped to a p-type dopant concentration of about $5*10^{19}/cm^3$ or greater. In an exemplary embodiment, in-situ doped p-type impurities in SiGe regions 248 are at least about two orders higher than in-situ doped p-type impurities in SiGe regions 246, if SiGe regions 246 are in-situ doped. SiGe regions 248 preferably have a germanium atomic percentage of between about 10 atomic percent and about 50 atomic percent. After the formation of epitaxy regions, the remaining portion of mask layer 40 is removed.

Figure 8:
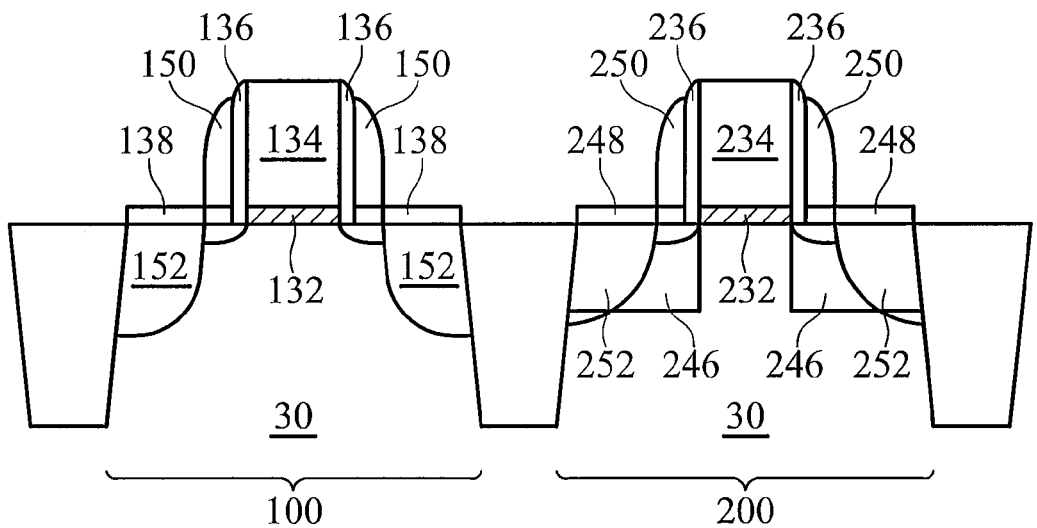

FIG. 8 illustrates the formation of main spacers 150 and 250, which are preferably formed by blanket depositing gate spacer layer(s), and then removing horizontal portions of the gate spacer layer(s). The deposition may be performed using commonly used techniques, such as plasma enhanced chemical vapor deposition (PECVD), low-pressure chemical vapor deposition (LPCVD), sub-atmospheric chemical vapor deposition (SACVD), and the like. The patterning may be performed by either wet etching or dry etching. In the preferred embodiment, main spacers 150 and 250 include liner oxide portions and overlying nitride portions. In alternative embodiments, main spacers 150 and 250 include one or more layers, each comprising oxide, silicon nitride, silicon oxynitride (SiON) and/or other dielectric materials.

Deep implantations are then performed to form deep source and drain regions 152 and 252 (herein after referred to as source/drain regions). As is known in the art, to form deep source/drain regions, a photoresist (not shown) is formed to cover NMOS region 100. An implantation is then preformed to introduce p-type impurities to form deep source/drain regions 252. The photoresist is then removed. An additional photoresist (not shown) is formed to cover PMOS region 200, and an implantation is preformed to introduce n-type impurities to form deep source/drain regions 152. The additional photoresist is then removed.

It is noted that raised epitaxy regions 138 and 248 form portions of source and drain extension regions (also referred to as lightly doped source and drain regions, or LDD regions). In subsequent annealing processes, the impurities in raised epitaxy regions 138 and 248 are driven into underlying substrate 30, hence extending LDD regions under respective offset spacers 136 and 236.

Figure 9:
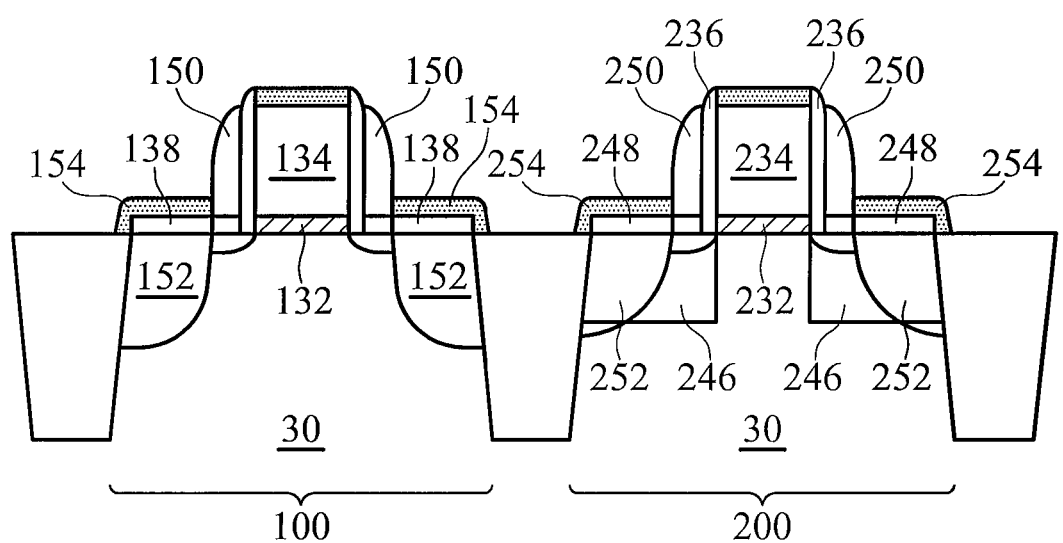

FIG. 9 illustrates the formation of silicide regions 154 and 254. Throughout the description, germano-silicide regions 254 are also referred to as silicide regions 254. As is known in the art, silicide regions 154 and 254 are preferably formed by blanket depositing a thin layer of metal, such as nickel, platinum, palladium, titanium, cobalt, and combinations thereof. The substrate is then heated, which causes silicon and germanium to react with the metal where contacted. After the reaction, a layer of metal silicide is formed between silicon (or silicon germanium) and metal. The un-reacted metal is selectively removed through the use of an etchant that attacks metal but does not attack silicide and germano-silicide.

In the embodiments discussed in preceding paragraphs, stressors are only formed for the PMOS device, but not for the NMOS device. This is due to the fact that the solubility improvement of n-type impurities from strain is relatively small, and thus may not justify the cost for forming stressors of NMOS devices. Silicon germanium stressors, however, are formed to maximize performance gain of PMOS devices.

The embodiments of the present invention have several advantageous features. First, the epitaxial growth of raised silicon regions, which needs high temperatures, is performed before the formation of LDD regions, including raised SiGe regions of PMOS devices. Therefore, the adverse effect to the LDD regions by high temperatures in the epitaxial growth of raised regions is reduced. The epitaxial growth of SiGe regions 246 and 248, on the other hand, needs lower temperatures. Therefore, it can be performed after the formation of LDD regions. Second, LDD regions are formed by in-situ doping impurities. As is known in the art, in-situ doped impurities have higher solubilities and activation rates than implanted impurities. Therefore, higher solubilities and activation rates are achieved. Third, higher solubilities and activation rates of impurities also reduce the resistivity of subsequently formed silicide regions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:
1. A semiconductor structure comprising:
   a semiconductor substrate comprising a PMOS region and an NMOS region;
   a PMOS device in the PMOS region comprising:

a first gate stack on the semiconductor substrate;
a first offset spacer on a sidewall of the first gate stack;
a first main spacer adjacent the first offset spacer;
a stressor in the semiconductor substrate and adjacent the first offset spacer, and wherein a bottommost surface of the first offset spacer abuts an uppermost surface of the stressor, wherein the first main spacer is in physical contact with the uppermost surface of the stressor, the stressor extending further from the first gate stack than the first main spacer in a direction parallel with a major surface of the semiconductor substrate;
a first raised source/drain region having a first raised region and a second raised region, the first raised region adjacent to the first offset spacer, the second raised region extending laterally from the first raised region and distally from an outermost sidewall of the first main spacer, wherein the first raised region is a first raised source/drain extension region having a bottommost surface on an uppermost surface of the stressor, wherein the first raised source/drain extension region has a higher p-type dopant concentration than the stressor; and
a PMOS deep source/drain region in the semiconductor substrate laterally adjacent to the stressor; and
an NMOS device in the NMOS region comprising:
a second gate stack on the semiconductor substrate;
a second offset spacer on a sidewall of the second gate stack;
a second main spacer adjacent the second offset spacer;
a second raised source/drain region having a third raised region and a fourth raised region, the third raised region adjacent to the second offset spacer, the fourth raised region extending laterally from the third raised region and distally from the second main spacer, wherein the third raised region is a second raised source/drain extension region on the semiconductor substrate and adjoining the second offset spacer; and
an NMOS deep source/drain region adjoining the second raised source/drain extension region, wherein the deep source/drain region is free from stressors formed in the semiconductor substrate.

2. The semiconductor structure of claim 1, wherein the first main spacer is on a top surface of the first raised source/drain extension region, and wherein the second main spacer is on a top surface of the second raised source/drain extension region.

3. The semiconductor structure of claim 1, wherein an interface between the stressor and the first raised source/drain extension region is substantially level with or higher than a top surface of the semiconductor substrate.

4. The semiconductor structure of claim 1, wherein the stressor extends under the first offset spacer.

5. The semiconductor structure of claim 1, wherein the first and the second raised source/drain extension regions are epitaxy regions.

6. The semiconductor structure of claim 1, wherein a concentration of a p-type impurity in the a first raised source/drain extension region is equal to or greater than $5*10^{19}/cm^3$.

7. A semiconductor structure comprising:
a semiconductor substrate comprising a PMOS region and an NMOS region;
a PMOS device in the PMOS region comprising:
a first gate stack on the semiconductor substrate;
a first offset spacer on a sidewall of the first gate stack;
a stressor in the semiconductor substrate and having a portion under the first offset spacer;
a first raised source/drain extension region and a first raised source/drain region extending laterally therefrom, a top surface of the first raised source/drain extension region coplanar with a top surface of the first raised source/drain region, the first raised source/drain extension region on the stressor and adjoining a sidewall of the first offset spacer, wherein the first raised source/drain extension region has at least a portion higher than a top surface of the semiconductor substrate, wherein the first raised source/drain extension region and the first raised source/drain region have different dopant concentrations; and
a first main spacer on a sidewall of the first offset spacer, wherein the first main spacer has at least a portion on a top surface of the first raised source/drain extension region, wherein the first raised source/drain region adjoins and extends laterally from an outermost sidewall of the main spacer; and
an NMOS device in the NMOS region comprising:
a second gate stack on the semiconductor substrate;
a second offset spacer on a sidewall of the second gate stack;
a second raised source/drain extension region and a second raised source/drain region extending laterally therefrom, the second raised source/drain extension region on the semiconductor substrate and adjoining the second offset spacer, wherein the second raised source/drain extension region and the second raised source/drain region have different dopant concentrations;
a second main spacer on a sidewall of the second offset spacer, wherein the second main spacer has at least a portion on a top surface of the second raised source/drain extension region, wherein the second raised source/drain extension region extends further from the second gate stack in a direction perpendicular with a sidewall of the second gate stack than the second main spacer; and
a deep source/drain region adjoining the second raised source/drain extension region, wherein a portion of the deep source/drain region lower than a top surface of the semiconductor substrate is free from stressors.

8. The semiconductor structure of claim 7, wherein an interface between the stressor and the first raised source/drain extension region is substantially level with a top surface of the semiconductor substrate.

9. The semiconductor structure of claim 7, wherein an interface between the stressor and the first raised source/drain extension region is higher than a top surface of the semiconductor substrate.

10. The semiconductor structure of claim 7, wherein a concentration of a p-type impurity in the a first raised source/drain extension region is equal to or greater than $5*10^{19}/cm^3$.

11. A semiconductor structure comprising:
a PMOS device in a semiconductor substrate, the PMOS device comprising:
a first gate stack on the semiconductor substrate;
a first offset spacer on a sidewall of the first gate stack;
a first main spacer adjacent to the first offset spacer;
a stressor in the semiconductor substrate and having a portion adjacent the first offset spacer, wherein the first main spacer is in physical contact with a surface of the stressor facing away from the semiconductor substrate, the stressor extending further from the first gate stack than the first main spacer in a direction parallel with the surface of the stressor;

a PMOS deep source/drain region in the semiconductor substrate, wherein a boundary of the PMOS deep source/drain region extends from a point within the stressor to a point outside of the stressor and into the semiconductor substrate;

a first raised source/drain extension region and a first raised source/drain region extending laterally therefrom, the first raised source/drain extension region on the stressor and adjoining the first offset spacer, the first raised source/drain extension region and the first raised source/drain region having different dopant concentrations, wherein the first raised source/drain region is at least partially contacting the deep source/drain region; and an NMOS device in the semiconductor substrate, the NMOS device comprising:

a second gate stack on the semiconductor substrate;

a second offset spacer on a sidewall of the second gate stack;

a second raised source/drain extension region and a second raised source/drain region extending laterally therefrom, the second raised source/drain extension region on the semiconductor substrate and adjoining the second offset spacer, the second raised source/drain extension region and the second raised source/drain region having different dopant concentrations; and an NMOS deep source/drain region adjoining the second raised source/drain extension region.

12. The semiconductor structure of claim 11, wherein the first raised source/drain extension region has at least a portion higher than a top surface of the semiconductor substrate.

13. The semiconductor structure of claim 11 further comprising:

a first main spacer on a sidewall of the first offset spacer, wherein the first main spacer has at least a portion on a top surface of the first raised source/drain extension region; and a second main spacer on a sidewall of the second offset spacer, wherein the second main spacer has at least a portion on a top surface of the second raised source/drain extension region.

14. The semiconductor structure of claim 11, wherein a portion of the NMOS deep source/drain region lower than a top surface of the semiconductor substrate is free from a stressor.

15. The semiconductor structure of claim 11, wherein an interface between the stressor and the first raised source/drain extension region is substantially level with or higher than a top surface of the semiconductor substrate.

16. The semiconductor structure of claim 11, wherein the stressor extends under the first offset spacer.

17. The semiconductor structure of claim 11, wherein the stressor comprises silicon germanium.

18. The semiconductor structure of claim 1, wherein the PMOS deep source/drain region is laterally adjacent to the stressor.

19. The semiconductor structure of claim 11, wherein the first raised source/drain region extends laterally away from the first main spacer.

20. The semiconductor structure of claim 7, further comprising a deep S/D beneath the first raised source/drain region, wherein a portion of the stressor extends beyond the deep S/D in a direction parallel with a major surface of the substrate.

* * * * *